United States Patent [19]

Altman et al.

[11] Patent Number: 5,198,264

[45] Date of Patent: Mar. 30, 1993

[54] METHOD FOR ADHERING POLYIMIDE TO A SUBSTRATE

[75] Inventors: Leonard F. Altman, Daytona Beach; Jill L. Flaugher, Margate; Barry M. Miles, Plantation, all of Fla.

[73] Assignee: Motorola, Inc., Schaumburg, Ill.

[21] Appl. No.: 584,958

[22] Filed: Sep. 19, 1990

Related U.S. Application Data

[63] Continuation-in-part of Ser. No. 429,294, Oct. 30, 1989, abandoned.

[51] Int. Cl.$^5$ .................................................. B05D 3/10
[52] U.S. Cl. ............................................. 427/96; 427/302; 427/304; 427/306; 427/307; 427/337; 427/343; 427/404; 427/412.1; 427/419.1; 427/419.5
[58] Field of Search .................. 427/302-307, 427/419.1, 404, 412, 419.5, 96, 337, 343

[56] References Cited

U.S. PATENT DOCUMENTS

| | | | |
|---|---|---|---|
| 4,238,528 | 12/1980 | Angelo et al. | 427/96 |
| 4,362,783 | 12/1982 | Graham | 428/338 |
| 4,719,145 | 1/1988 | Neely | 427/302 |
| 4,859,571 | 8/1989 | Cohen et al. | 427/302 |
| 4,880,684 | 11/1989 | Boss et al. | 427/96 |

*Primary Examiner*—Janyce Bell
*Attorney, Agent, or Firm*—Dale W. Dorinski; Daniel K. Nichols

[57] ABSTRACT

A method of adhering a polyimide to a substrate includes first placing the substrate in a dilute acid solution. The substrate is then placed in a palladium and tin solution followed by a rinse with water. The rinsed substrate is placed in an accelerator solution to substantially remove the tin from the substrate. The palladium which remains on the substrate surface provides nucleation sites for adhesion promotion and enhanced wetting of polyimide which is applied in a liquid form as by spraying or spinning. Adhesion of polyimide to metals such as gold, ceramics, alumina or polyimide is thereby provided.

4 Claims, No Drawings

METHOD FOR ADHERING POLYIMIDE TO A SUBSTRATE

CROSS-REFERENCE TO RELATED APPLICATIONS

This is a continuation in part of application Ser. No. 429,294 filed Oct. 30, 1989, now abandoned.

BACKGROUND OF THE INVENTION

This invention relates to a method of applying polyimide to a substrate in general, and particularly to a method in which liquid polyimide is adhered to the substrate.

Polyimide, due to its electrical and mechanical properties, is a desirable material for use on substrates, both as a base, as well as a material for use in providing layers of a multi-layer circuit board, and as a cover for the metal conductors. However, it is difficult to obtain good adhesion between liquid polyimide and cured polyimide, metals such as gold, and substrate materials. It is desirable to be able to build up layers of polyimide; however, known prior art approaches where multiple layers of polyimide are applied, are subject to cracking and delaminating of the polyimide, both over metallic runners and pads, such as gold and between layers of polyimide. In addition to poor adhesion to gold metal and cured polyimide resin, these surfaces also cause the liquid polyimide to dewet, creating voids and pinholes in the coating. In order to apply polyimide coatings to substrates, and build up successive layers of polyimide, these problems must be eliminated. The present method of applying liquid polyimide utilizes nucleation sites to provide adhesion promotion and enhanced wetting between the liquid polyimide and the materials to which it is applied.

SUMMARY OF THE INVENTION

In the present invention, a solution of palladium and tin is applied to a substrate, and the tin is then removed, leaving the palladium, which provides nucleation sites for adhesion promotion of a liquid polyimide that is subsequently applied to the substrate. The adhesion promoter also serves to increase wetting of the liquid polyimide to gold metal and the substrate.

A method of adhering polyimide to a substrate comprises the steps of applying palladium and tin solutions to the substrate, applying an accelerator solution to substantially remove the tin from the substrate and applying a liquid polyimide to the substrate. In one aspect of the invention, the step of applying the palladium nucleation sites includes applying a palladium and tin solution. In another aspect of the invention, the substrate is rinsed prior to the application of the accelerator. In still another aspect of the invention, the substrate is rinsed after application of the accelerator. In yet another aspect of the invention, the rinsing steps comprise rinsing with water.

DETAILED DESCRIPTION OF THE PREFERRED EMBODIMENT

A substrate of ceramic, alumina, or polyimide can include circuit traces or pads having gold, copper, lead or tin plated metal surfaces. Utilizing known approaches, it is difficult to obtain adhesion of a liquid polyimide to such surfaces. In order to prepare the substrate surface for application of liquid polyimide, the substrate is first place in a pretreatment bath. The bath is a dilute acid solution maintained at a pH of about 0.2, with about 1% by weight of acidic salts. Typical examples are available under the trade names of Cataprep ® 404, from the Shipley Co. of Newton, Mass., or Sel-Rex Circuitprep ® 3023, from the Enthone/OMI Co. of Nutley, N.J. The purpose of the bath is to maintain the acid normality and specific gravity of the following catalyst bath. In the preferred embodiment, the substrate is placed in a bath of this solution at 90 to 120 degrees F. for about 30 to 60 seconds. The substrate is removed from the pretreatment bath and placed in a catalyst bath consisting of a palladium and stannous chloride colloid solution, with a palladium concentration of about 1 gram per gallon, a specific gravity of about 1.2 and a pH of about 1. Stannous chloride is combined with palladium chloride to form a colloidal dispersion of a catalytic metal. Stannous chloride in the bath acts as a protective colloid for the catalyst, stabilizing the catalyst against agglomeration and premature precipitation. Excess stannous ions relative to palladium ions are necessary to stabilize the catalyst. Typical examples of the catalyst baths are available under the trade names of Cataposit ® 44, from the Shipley Co. or Sel-Rex Circuitprep ® 3316, from the Enthone/OMI Co. Preferably, this bath is also at approximately 90 to 120 degrees F. and the substrate is placed in the bath for about 2 to 4 minutes. Upon immersion in the catalyst solution, the palladium and tin colloids are adhered to the surface of the substrate to form nucleation sites. The use of the catalyst particularly enhances the subsequent adhesion of the liquid polyimide to the cured polyimide and the gold.

After removal from the catalyst bath, the substrate is rinsed, as with deionized water, in order to prevent contamination of the next bath. The substrate is placed in a bath consisting of an accelerator or stripping solution to remove the protective colloid from the palladium on the substrate surface while leaving the palladium. The bath is typically a dilute acid, such as hydrochloric acid, at a pH of below about 1. The low pH of the bath serves to maintain the catalyst stability. Some suitable accelerators are Accelerator ® 240 from the Shipley Co., and Sel-Rex Circuitprep ® 4044 from the Enthone/OMI Co. Preferably, the accelerator bath is maintained at about 100 degrees F. and the substrate is left in this bath for 3 minutes. After completion of the bath, the substrate is again cleaned as by rinsing with deionized water.

It should be appreciated that the compositions of the various pretreatment, catalyst, and accelerator baths are well known to those skilled in the art of metal plating, and other equivalent proprietary catalytic baths may be substituted with similar results.

The substrate is then dried and a liquid layer of polyimide material is applied, as by spraying or spinning, and the liquid polyimide is cured. The palladium that remains on the surface of the substrate promotes adhesion and enhances the wetting of the liquid polyimide to both the gold or other metallic areas, as well as prior polyimide, or ceramic layers to which the polyimide is applied.

In order to provide additional layers, or build up the thickness of polyimide, the process can be repeated for as many times as required. If a multi-layer structure is to be produced, metallized circuit traces can be applied to the polyimide layer prior to the application of the subsequent polyimide layer.

We claim as our invention:

1. A method of adhering polyimide to a printed circuit substrate comprising the steps of:
   applying a layer of palladium and tin colloid to the substrate by immersing the substrate in a solution comprising palladium and a stannous chloride colloid;
   substantially removing the stannous chloride colloid from the substrate by immersing the substrate in a solution of dilute acid;
   drying the substrate;
   applying a layer of liquid polyimide on the palladium and tin colloid layer; and
   curing the liquid polyimide to form a dry film.

2. A method of adhering polyimide to a substrate as defined in claim 1 wherein the step of applying a layer of palladium and tin colloid includes first immersing the substrate in a dilute acid solution and then immersing in a palladium and tin solution.

3. A method of adhering polyimide to a substrate as defined in claim 2 wherein the substrate is rinsed prior to removal of the tin colloid.

4. A method of adhering polyimide to a printed circuit substrate having metallized circuit traces, comprising the steps of:
   applying a layer of palladium and tin colloid to the substrate and the metal circuit traces by immersing the substrate in a solution comprising palladium and a stannous chloride colloid having a palladium concentration of about one gram per gallon;
   substantially removing the stannous chloride colloid from the substrate and the metal circuit traces by immersing the substrate in a solution comprising dilute acid having a pH of about 1;
   drying the substrate;
   depositing a layer of liquid polyimide on the substrate; and
   curing the liquid polyimide to form a dry film. t
   * * * * *